United States Patent [19]

Howseman, Jr.

[11] Patent Number: 4,784,582

[45] Date of Patent: Nov. 15, 1988

[54] FLUID DISPENSING PUMP

[75] Inventor: William E. Howseman, Jr., Sun Valley, Calif.

[73] Assignee: Creative Automation Company, Sun Valley, Calif.

[21] Appl. No.: 103,721

[22] Filed: Oct. 2, 1987

[51] Int. Cl.$^4$ .......................... F04B 9/08; F04B 15/02
[52] U.S. Cl. ................................... 417/375; 417/490; 222/378
[58] Field of Search ................ 417/490, 375; 222/460, 222/461, 462, 378, 389; 184/29, 39

[56] References Cited

U.S. PATENT DOCUMENTS

| 2,232,522 | 2/1941 | Gray | 222/378 |
| 3,595,340 | 7/1971 | Obergefell | 184/29 X |
| 4,577,783 | 3/1986 | Racca et al. | 222/389 X |
| 4,664,299 | 5/1987 | Goncalves | 222/378 X |

FOREIGN PATENT DOCUMENTS 0945048  6/1956  Fed. Rep. of Germany ...... 222/378

2142389  1/1985  United Kingdom ............... 417/375

Primary Examiner—William L. Freeh
Assistant Examiner—Eugene L. Szczecna, Jr.
Attorney, Agent, or Firm—Linval B. Castle

[57] ABSTRACT

A pneumatically operated pump for dispensing controlled shots of paste material includes a disposal paste syringe tube having a ferrule with an axial dispensing hole centered in the bottom. An axial movable plunger extending through the length of the syringe normally fits into and blocks the dispensing hole, but when the punger is lifted a predetermined amount, the paste under a small pressure flows into the space and, when a driver returns the plunger to its normal position, the paste column is shot through the dispensing hole. The driver for moving the plunger includes a spring loaded diaphram center connected to the drive end of the plunger. Applied air pressure against the diaphragm lifts the plunger and compresses the spring. On release of the pressure, the spring rapidly drives the plunger back to its normal position to dispense a small column of paste.

11 Claims, 1 Drawing Sheet

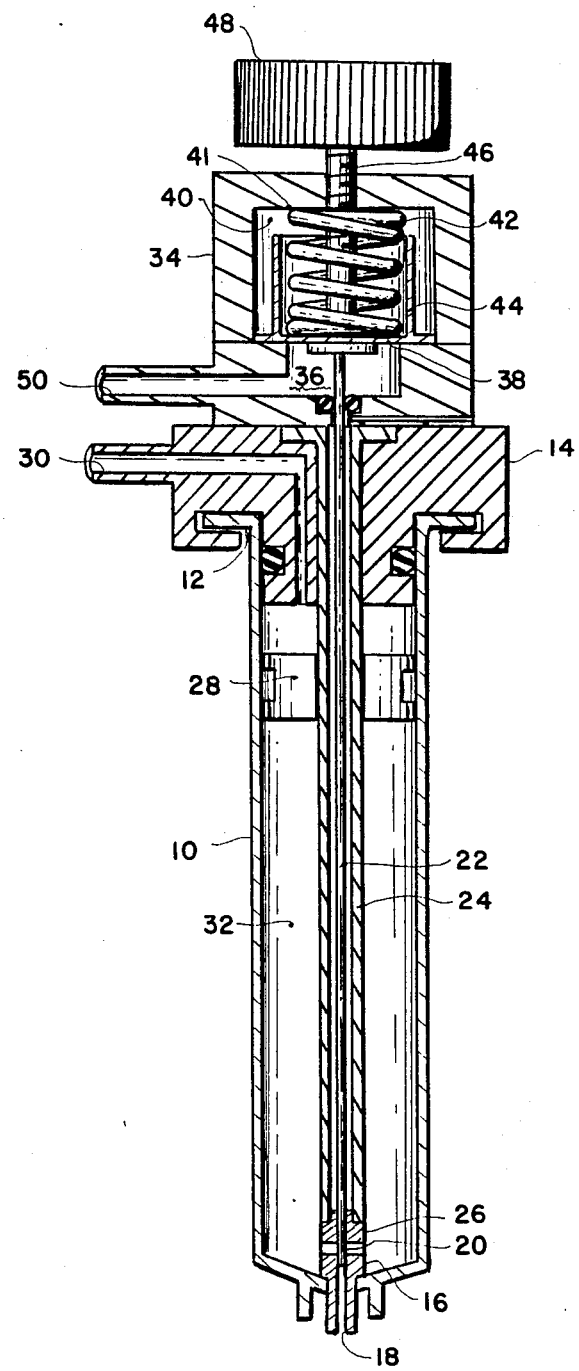

FLUID DISPENSING PUMP

BRIEF SUMMARY OF THE INVENTION

This invention relates generally to dispensing pumps and in particular to a novel pneumatically operated positive displacement pump for rapidly metering very small sized shots of viscous fluids or paste materials.

Positive displacement dispensing pumps of this type are invaluable, for example, in the assembly of electronic circuit boards for depositing very small shots of a slurry paste containing flux and solder particles. For such applications, the dispensing pump may be hand held while in many of such applications, the pump is part of an automated computer controlled robotic system such as disclosed in U.S. Pat. No. 4,572,103.

Some advantages of the pump to be described over existing dispensing pumps are that the present pump is very small and lightweight, thus making it ideal for use in lightweight robotic equipment or for longer manual use without tiring the technician. Another important advantage is that supplies of the desired material to be dispensed may be provided in several standard size disposable dispensing syringes which may be very quickly and easily attached to the pump, thus saving a considerable amount of costly production time. Still another feature is that the pump to be described is very quickly and easily cleaned because there are no fluid or paste conduits or passageways which can become permanently blocked by certain types of dried pastes.

Briefly described, the dispensing pump of the invention includes a housing containing a pneumatic pump drive in which air pressure against a diaphragm lifts a pump plunger rod and compresses a spring which, when released by release of the air pressure, sharply drives down the shroud covered plunger that extends through the syringe containing the paste to the pump located below the end of the shroud. The pump is located on the end of the shroud and the plunger tip within the pump fits into and seals off the axial opening in a metal fitment to which may be attached a well know Luer Lock dispensing tip. When the applied air pressure compresses the drive spring and lifts the plunger, the plunger tip is lifted from the axial pump opening in the fitment and fluid in the syringe, under a low pressure from a follower plug in the syringe, is forced into the now vacated opening between the plunger end and the fitment. When the applied air pressure is removed and the compressed spring is released, the plunger shoots the paste column thus formed through the fitment and dispensing tip. The small volume of fluid shot by the pump is accurately controlled by a screw adjustment of the plunger rod stroke against the drive spring.

BRIEF DESCRIPTION OF THE DRAWINGS

The single drawing of the preferred embodiment is a sectional view illustrating the details of the fluid dispensing pump with an attached material syringe.

DETAILED DESCRIPTION

Illustrated in the drawing is a fluid dispensing pump having an attached syringe 10 for the storate of the viscous fluid or paste material to be dispensed. The syringe, which may be disposable or may be cleaned for reuse as desired, may be formed of plastic, glass, or metal, and is formed with an outward extending flange 12 at its upper open end which secures the syringe to a housing 14. In the preferred embodiment, the flange is formed in two quarter circular sectors which engage a similar pair of quarter sectors in the housing and thus operate as a bayonet type lock.

The opposite or dispensing end of the syringe 10 is formed with an opening to receive a ferrule 16 which forms a part of a positive displacement pump which will be later described. The exterior surface of the ferrule is preferably tapered as it extends through the axial end of the syringe to receive a conventional Luer Lock dispensing tip which extends the effective length of the tip. Drilled axially through the ferrule 16 is a dispensing hole 18 having a diameter very slightly larger than the diameter of a pump plunger tip 20 which normally fits into the dispensing hole 18 to seal it against leakage of viscous fluid within the syringe.

The plunger tip 20 is the extreme lower end of a pump plunger rod 22 contained within a tubular shroud 24 that is secured at its top end to the housing 14 and extends axially through the syringe 10 to terminate at a bushing 26 which seals the end of the shroud 24 and contains an axial hole through which the plunger rod 22 may slide. The bushing 26 and ferrule 16 are formed from one tubular member secured to the end of the shroud 24, and the space separating the adjacent parts of the bushing and ferrule contain two or more lateral side openings for admitting fluid contained in the syringe 10. If desired, the shroud 24, bushing 26, and ferrule 16 may be formed from a single tubular member.

The movement of the plunger tip 20 from its normal position in the dispensing hole 18 up toward the bushing 26 and then its rapid descent through the space between the faces of the busing 26 and ferrule 16, now filled with a column of fluid to be dispensed, and into the dispensing hole 18 provides the pumping action of the fluid dispensing pump.

The raising of the plunger tip 20, without providing pressure to the material within the syringe, will create a vacuum in the pump area which could result in the withdrawal of a previously pumped column of material from the dispensing hole 18. To prevent this and to assure that a fluid or heavy paste material in a syringe 10 will form a column to fill that vacuum between the parallel faces of the plunger bushing 26 and ferrule 16 when the plunger tip 20 is raised, pressure is applied by a longitudinally slidable material follower plug 28 or piston in contact with the inner wall of the syringe 10 and exterior wall of the plunger shroud 24. The plug 28 is positioned on the top surface of the material within the syringe 10 and a relatively low pneumatic pressure is applied through the input port 30 in the housing 14 and is directed into the flange end of the syringe to apply the required pressure against the plug 28 to cause it to force the material confined within the reservoir 32 of the syringe 10 into a location between the flat plates of the bushing 26 and ferrule 16 when the plunger tip 20 has been raised. The amount of pneumatic pressure applied through the input port 30 will, of course, depend upon the viscosity of the material being dispensed but is normally in the range of 5-20 p.s.i.

The axial movement of the pump plunger 22 which provides the above described pump action is provided by a plunger drive assembly within a drive assembly housing 34 removably mounted to the end of the housing 14. The upper end of the pump plunger rod 22 passes through the end of the housing 14 and into a vented area of the drive assembly housing 34 and then through an O-ring seal into a circular cavity 36 in the housing 34. Within this cavity 36, the end of the rod 22 is connected to the center of a perpendicular disc mounted to the first surface of a diaphragm 38, the second surface of which lies within a cylinder 40 and normal to the axis thereto. Positioned within the cylinder 40 between the diaphragm 38 and opposite end cylinder wall 41 is a relatively strong spring 42 confined within a tubular spring cup 44 to assure spring alignment. A stroke length adjustment screw 46, rotatable by a suitable manual adjustment knob 48, is threaded through the end cylinder wall 41 and terminates near the surface of the diaphragm 38. Adjustment of the stroke length of the plunger rod 22 will similarly adjust the volume or shot size of the fluid ejected by the pump.

Loading stroke air at a pressure of about 50 p.s.i. is applied through an input port 50 into the cavity 36 and against the lower surface of the diaphragm 38. This lifts the diaphragm 38 and the plunger rod 22 and compresses the spring. At this point, the plunger tip 20 has been removed from the ferrule dispensing hole 18 and the continuous air supply applied through the input port 30 into the flange end of the syringe 10 will have forced down the follower plug 28 the amount necessary to force a small amount of the viscous fluid into the void created by the raised plunger tip. When the pressure of the loading stroke air is released, the spring rapidly returns the diaphragm 38 and plunger rod 22 to its original position at which the plunger tip 20 has re-entered the axial dispensing hole in the ferrule 16. The rapid return of the plunger tip will have forced a column of dispensing material of corresponding volume through the dispensing hole 18.

I claim:

1. A pump for dispensing small individual quantities of a viscous fluid, said pump comprising:
    a closed container for the storage of a viscous fluid to be dispensed, said container having first and second ends;
    means in the first end of said container for receiving a pump element, said element having a dispensing hole therethrough for dispensing said fluid from said container;
    a movable piston within said container, in a first position said piston having a tip end blocking said dispensing hole to prevent escape of fluid from said container;
    drive means including a drive assembly housing positioned at the second end of said container and having an axially movable spring biased diaphragm coupled to said piston for moving said piston tip end in a direction axially of said dispensing hole and a predetermined distance therefrom to a second position to enable a column of viscous fluid to flow into the space vacated by said tip movement, said drive means further including means for applying pneumatic pressure to said diaphragm and against the loading of said spring for moving said piston tip from its first to second position, the release of said pneumatic pressure rapidly returning said piston tip from its second position to its first position to dispense said column of viscous fluid through said dispensing hole,
    said drive means includes stroke adjustment means for adjusting the amount of axial movement of said plunger and the shot size of fluid to be ejected by said pump;
    piston means within said tubular storage means and overlying said viscous fluid for applying pressure to said fluid to force said fluid into the void created by the removal of said plunger tip from said first to said second position,
    wherein said piston means is urged against said fluid by pneumatic pressure applied through said housing into the second end of said tubular storage means; and
    the pump element attached to the first end of said tubular shroud includes an axially spaced plunger bushing and ferrule, said ferrule having an axial opening and being mounted in an opening through the first end of said tubular container, the space between said ferrule and said bushing having at least one radial side opening to permit the entry of fluid from said container.

2. The pump claimed in claim 1 wherein said viscous fluid in said closed container is pressurized by a slidable follower plug within said container, said plug being moved by force applied through the second end of said container.

3. The pump claimed in claim 2 wherein said drive means includes piston stroke length adjustment means for controlling the distance of movement of said piston to said second position and the volume of fluid to be dispensed by said pump.

4. A pump for dispensing small individual quantities of a viscous fluid, said pump comprising:
    a housing;
    tubular storage means for containing a supply of the viscous fluid to be dispensed, said tubular means having a first end and a second end, said second end being removably attached to said housing;
    a tubular shroud axially located within said tubular storage means, said shroud having a first and a second end, the second end of said shroud being coupled to said housing;
    a pump element positioned within an axial opening in the first end of said tubular storage means, said pump element being attched to the first end of said tubular shroud, said element sealing the first end of said tubular means and having an axial fluid dispensing hole therethrough;
    an axially movable plunger slideably extending through said tubular shroud, said plunger having a drive end within said housing and a tip end in said pump element, in a first position said tip end closely fitting within said axial fluid dispensing hole to block the escape of fluid from said storage means;
    drive means within said housing and including an axially movable spring biased diaphragm coupled to the drive end of said plunger for axially moving said plunger a predetermined distance to remove said tip end from its first position in said fluid dispensing hole to a second position to enable surrounding fluid within said storage means to flow to the void left by such plunger tip removal, said drive means further including means for applying pneumatic pressure to said diaphragm and against the loading of said spring for moving said plunger tip end from its first to second position, the release of said pneumatic pressure then returning said plunger tip to its first position to drive the fluid formed under said plunger tip through said fluid dispensing hole,
    said drive means includes a stroke adjustment means for adjusting the amount of axial movement of said plunger and the shot size of fluid to be ejected by said pump; piston means within said tubular storage means and overlying said viscous fluid for applying pressure to said fluid to force said fluid into the void created by the removal of said plunger tip from said first to said second position, wherein said piston means is urged against said fluid by pneumatic pressure applied through said housing into the second end of said tubular storage means; and the pump element attached to the first end of said tubular shroud included an axially spaced plunger bushing and ferrule, said ferrule having an axial opening and being mounted in an opening through the first end of said tubular container, the space between said ferrule said bushing having at least one radial side opening to permit the entry of fluid from said container.

5. The pump claimed in claim 4 wherein said drive means includes stroke adjustment means for adjusting the amount of axial movement of said plunger and the shot size of fluid to be ejected by said pump.

6. The pump claimed in claim 5 further including piston means within said tubular storage means and overlying said viscous fluid for applying pressure to said fluid to force said fluid into the void created by the removal of said plunger tip from said first to said second position.

7. The pump claimed in claim 6 wherein said piston means is urged against said fluid by pneumatic pressure applied through said housing into the second end of said tubular storage means.

8. The pump claimed in claim 7 wherein the pump element attached to the first end of said tubular shroud includes an axially spaced plunger bushing and ferrule, said ferrule having an axial opening and being mounted in an opening through the first end of said tubular container, the space between said ferrule and said bushing having at least one radial side opening to permit the entry of fluid from said container, 9. The pump claimed in claim 8 wherein said stroke adjustment means is an adjustable screw axially located in said drive assembly housing and terminating at a predetermined point near the surface of said diaphragm for limiting the movement of said diaphragm upon the application of pressure to the opposite surface thereto.

10. The pump claimed in claim 9 wherein the second end of said tubular storage means is flanged and formed in sectors for a rapid bayonet type attachment to a corresponding sectored socket depending from said housing.

11. A positive displacement pump for dispensing individual quantities of fluid from an associated fluid container, said pump comprising:

a movable piston having a tip end and a drive end;

a tubular shroud through which said piston may slideably move, said shroud having a first and second end;

a ferrule attached to the first end of said tubular shroud, said ferrule having an input end coupled to said first shroud end and an output end for dispensing fluid, said ferrule having an opening between said input end and output end and coaxial with said movable piston, the input end of said ferrule opening accomodating the tip end of said piston for sealing said opening;

at least one fluid input port through a wall of said shroud and adjacent the input end of said ferrule for admitting fluid thereto from an associated fluid container;

a housing containing an axially movable spring biased diaphragm coupled to the drive end of said movable piston;

means for applying pneumatic pressure into said housing to said diaphragm and against the loading of said spring for removing said piston tip from the opening in said ferrule and thereafter releasing the pneumatic pressure for driving said piston tip into said opening to dispense fluid therethrough, said drive means includes stroke adjustment means for adjusting the amount of axial movement of said plunger and the shot size of fluid to be ejected by said pump;

piston means within said tubular storage means and overlying said viscous fluid for applying pressure to said fluid to force said fluid into the void created by the removal of said plunger tip from first to said second position, wherein said piston means is urged against the fluid by pneumatic pressure applied through said housing into the second end of said tubular storage means; and the pump element attached to the first end of said tubular shroud includes an axially spaced plunger bushing and ferrule, said ferrule having an axial opening and being mounted in an opening through the first end of said tubular container, the space between said ferrule and said bushing having at least one radial side opening to permit the entry of fluid from said container.

* * * * *